US008438358B1

(12) United States Patent
Kraipak et al.

(10) Patent No.: US 8,438,358 B1
(45) Date of Patent: May 7, 2013

(54) SYSTEM-ON-CHIP WITH MEMORY SPEED CONTROL CORE

(75) Inventors: Waseem Saify Kraipak, Maharashtra (IN); George Bendak, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 643 days.

(21) Appl. No.: 12/729,210

(22) Filed: Mar. 22, 2010

Related U.S. Application Data

(63) Continuation-in-part of application No. 12/687,817, filed on Jan. 14, 2010, which is a continuation-in-part of application No. 12/639,064, filed on Dec. 16, 2009.

(51) Int. Cl.
| | |
|---|---|
| *G06F 12/00* | (2006.01) |
| *G06F 13/00* | (2006.01) |
| *G06F 13/28* | (2006.01) |
| *G06F 11/00* | (2006.01) |
| *G11C 29/00* | (2006.01) |
| *G11C 7/04* | (2006.01) |
| *G11C 11/34* | (2006.01) |
| *H01L 35/00* | (2006.01) |
| *H01L 37/00* | (2006.01) |
| *G06F 1/00* | (2006.01) |
| *G06F 1/32* | (2006.01) |

(52) U.S. Cl.
USPC ........... 711/167; 714/704; 714/721; 365/211; 365/212; 327/512; 327/513; 713/320; 713/322

(58) Field of Classification Search .................. None
See application file for complete search history.

(56) References Cited

U.S. PATENT DOCUMENTS

2006/0280018 A1 * 12/2006 Cases et al. .................. 365/226
2010/0011233 A1 * 1/2010 Halepete et al. .............. 713/322

OTHER PUBLICATIONS

A 32-bit PowerPC system-on-a-chip with support for dynamic voltage scaling and dynamic frequency scaling IEEE jornal of solid state circuits, vol. 37 No. 11, Nov. 2002 Nowka et al. pp. 1441-1447.*

* cited by examiner

*Primary Examiner* — Yaima Campos
*Assistant Examiner* — Marwan Ayash
(74) *Attorney, Agent, or Firm* — Turocy & Watson, LLP (57) ABSTRACT

A system and method are provided for using a system-on-chip (SoC) memory speed control logic core to control memory maintenance and access parameters. A SoC is provided with an internal hardware-enabled memory speed control logic (MSCL) core. An array of SoC memory control parameter registers is accessed and a set of parameters is selected from one of the registers. The selected set of parameters is delivered to a SoC memory controller, to replace an initial set of parameters, and the memory controller manages an off-SoC memory using the delivered set of parameters.

10 Claims, 5 Drawing Sheets

SYSTEM-ON-CHIP WITH MEMORY SPEED CONTROL CORE

RELATED APPLICATIONS

This application is a Continuation-in-Part of a pending application entitled, SYSTEM-ON-CHIP WITH THERMAL MANAGEMENT CORE, invented by Waseem Kraipak et al., Ser. No. 12/687,817, filed Jan. 14, 2010;

which is a Continuation-in-Part of a pending application entitled, SYSTEM-ON-CHIP WITH FEEDBACK LOOP FOR PROCESSOR FREQUENCY CONTROL, invented by Waseem Kraipak et al., Ser. No. 12/639,064, filed Dec. 16, 2009. Both these applications are incorporated herein by reference.

BACKGROUND OF THE INVENTION

1. Field of the Invention

This invention generally relates to system-on-chip (SoC) off-SoC memory management and, more particularly, to a system and method for using a SoC hardware core to control the frequency of memory operations.

2. Description of the Related Art

As noted in Wikipedia, a memory controller is a digital circuit that manages the flow of data going to and from the main memory. The memory controller can be a separate chip or integrated into another chip, such as on the die of a microprocessor. Computers using Intel microprocessors have conventionally had a memory controller implemented on their motherboard's Northbridge, but some modern microprocessors, such as DEC/Compaq's Alpha 21364, AMD's Athlon 64 and Opteron processors, IBM's POWER5, Sun Microsystems UltraSPARC T1, and more recently, Intel Core i7 have a memory controller on the microprocessor die to reduce the memory latency. While this arrangement has the potential of increasing system performance, it locks the microprocessor to a specific type (or types) of memory, forcing a redesign in order to support newer memory technologies. When the memory controller is not on-die, the same CPU may be installed on a new motherboard, with an updated Northbridge.

The integration of the memory controller onto the die of the microprocessor is not a new concept. Some microprocessors in the 1990s such as the DEC Alpha 21066 and HP PA-7300LC had integrated memory controllers, but to reduce the cost of systems by removing the requirement for an external memory controller instead of increasing performance.

Memory controllers contain the logic necessary to read and write dynamic random access memory (DRAM), and to "refresh" the DRAM by sending current through the entire device. Without constant refreshes, DRAM loses the data written to it as the capacitors leak their charge within a fraction of a second (not less than 64 milliseconds according to JEDEC standards).

Reading and writing to DRAM is facilitated by use of multiplexers and demultiplexers, by selecting the correct row and column address as the inputs to the multiplexer circuit, where the demultiplexer on the DRAM can select the correct memory location and return the data (once again passed through a multiplexer to reduce the number of wires necessary to assemble the system).

Bus width is the number of parallel lines available to communicate with the memory cell. Memory controller bus widths range from 8-bit in earlier systems, to 512-bit in more complicated systems and video cards. Double data rate (DDR) memory controllers are used to drive DDR SDRAM, where data is transferred on the rising and falling access of the memory clock of the system. DDR memory controllers are significantly more complicated than Single Data Rate controllers, but allow for twice the data to be transferred without increasing the clock rate or increasing the bus width to the memory cell.

Dual Channel memory controllers are memory controllers where the DRAM devices are separated onto two different buses, allowing two memory controllers to access them in parallel. This dual arrangement doubles the theoretical amount of bandwidth of the bus. In theory, more channels can be built (a channel for every DRAM cell would be the ideal solution), but due to wire count, line capacitance, and the need for parallel access lines to have identical lengths, more channels are very difficult to add.

Fully buffered memory systems place a memory buffer device on every memory module (called an FB-DIMM when Fully Buffered RAM is used), which unlike conventional memory controller devices, use a serial data link to the memory controller instead of the parallel link used in previous RAM designs. This decreases the number of the wires necessary to place the memory devices on a motherboard (allowing for a smaller number of layers to be used, meaning more memory devices can be placed on a single board), at the expense of increasing latency (the time necessary to access a memory location). This latency increase is due to the time required to convert the parallel information read from the DRAM cell to the serial format used by the FB-DIMM controller, and back to a parallel form in the memory controller on the motherboard. In theory, the FB-DIMM's memory buffer device could be built to access any DRAM cells, allowing for memory cell agnostic memory controller design, but this has not been demonstrated, as the technology is in its infancy.

Regardless of whether the memory control is a separate device or embedded with the microprocessor, memory parameters are conventionally set at power on, and cannot be changed during operation. Changing memory parameters while the system is running requires many factors to be taken into account and, requires specialized logic that adds to the cost of the chips. Given that low cost is a key selling factor, and that battery life and power efficiency are less so, means that such functionality has not been addressed before.

Changing the memory hardware timing on-the-fly can lead to complications, such as memory corruption, microprocessor hang ups due to glitches and loss of state. Typically, such an operation would require the impacted cores be temporarily halted, VCO frequencies to be changed, and interfaces to be recalibrated. None of these tasks are trivial. These tasks are typically performed at power-on because there are no applications running at that time.

It would be advantageous if memory access speeds could be changed on-the-fly using a memory speed control core (hardware block) in a SoC.

SUMMARY OF THE INVENTION

Described herein are a system and method to change the speed of a memory controller (and memory) on-the-fly. This technique can be used in conjunction with the thermal management of a double data rate (DDR) memory, for example. In the event of overheating, a system-on-chip (SoC) thermal management core can instruct the DDR Controller to change the speed of the DDR Memory, to reduce the dual in-line memory module (DIMM) temperature or the DIMM Ambient Temperature. Further, the technique can be used for a power saving mode, when maximum performance is permitted by the thermal conditions, but is not required. For instance, if the central processing unit (CPU) core is slowed, the memory can be slowed down as well, to a more power efficient rate, still sufficient to support the CPU. Advantageously, the speed parameters of the memory controller RAM can be modified, to support different memory speeds, without resetting the system and without losing the data in the RAM. No data is lost since the RAM is put in self-refresh mode before changing the RAM speed.

Accordingly, a method is provided for using a SoC memory speed control logic core to control memory maintenance and access parameters. A SoC is provided with an internal hardware-enabled memory speed control logic (MSCL) core. An array of SoC memory control parameter registers is accessed and a set of parameters is selected from one of the registers. The selected set of parameters is delivered to a SoC memory controller, to replace an initial set of parameters, and the memory controller manages an off-SoC memory using the delivered set of parameters.

More explicitly, the selected set of parameters is delivered to the SoC memory controller in response to the MSCL asserting a hold signal, so that no new memory transactions are generated by a processor. After waiting for any current memory transactions to complete, the MSCL sends a self-refresh command to the memory controller. After the selected parameters are written into the memory controller, the self-refresh command is deasserted, and then the hold signal is deasserted.

In one aspect, a thermal trip memory speed command is accepted representing an overheating state, and a thermal cool-down register of default minimum frequency control parameters is automatically selected. Alternately, the MSCL accepts an auto-change memory speed command associated with a one of a plurality of memory operating frequencies. Then, the MSCL sends a parameter select signal to the array memory control parameter registers, selects a particular register in response to the parameter select signal, and reads a particular set of parameters from the selected register associated with the commanded memory operating frequency.

Additional details of the above-described method, and a SoC with memory speed control logic to control memory maintenance and access parameters, are provided below.

DETAILED DESCRIPTION

Figure 1:
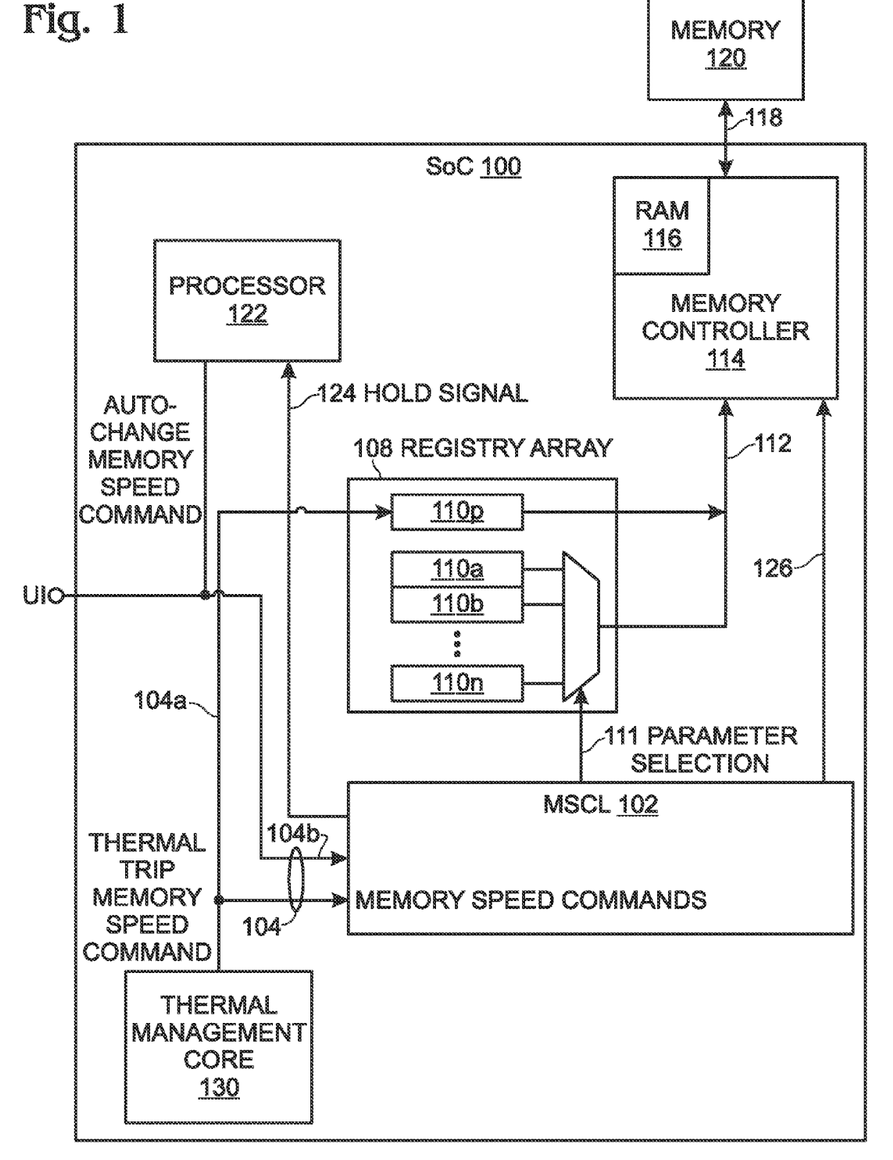
FIG. 1 is a schematic block diagram of a system-on-chip (SoC) with memory speed control logic to control memory maintenance and access parameters.

FIG. 1 is a schematic block diagram of a system-on-chip (SoC) with memory speed control logic to control memory maintenance and access parameters. The SoC 100 comprises an internal hardware-enabled memory speed control logic (MSCL) core 102 having an interface on line 104 to accept memory speed commands and an interface on line 106 to supply parameter select commands. The SoC 100 includes an array 108 of memory control parameter registers 110 having an interface on line 111 to supply a selected a set of parameters from one of the registers 110. Shown are registers 110a through 110n, where n is a variable not limited to any particular value. A memory controller 114 has an interface on line 112 to accept the selected set of parameters from the register array 108, to replace an initial set of parameters in RAM 116. The memory controller 114 has an interface on line 118 connected to an off-SoC memory 120. The memory controller 114 manages the off-SoC memory 120 using the set of parameters accepted on line 112. The memory controller 114 is shown as a component of the SoC 100. The SoC 100 also comprises a processor 122. Typically, the processor 122, which may also be referred to as a microprocessor or central processing unit (CPU), executes instructions received on the data/address bus (see 204, FIG. 2) at an operating frequency responsive to the voltage level on the supply voltage interface (not shown). The MSCL 102 has an interface connected to the processor 122 on line 124 and an interface connected to the memory controller 114 on line 126. Subsequent to receiving a memory speed change command on line 104, the MSCL 102 asserts a hold signal to the processor on line 124, so that no new memory transactions are generated by the processor 122, and waits for current memory transactions to complete. The memory speed commands on line 104 may be sourced from an off-chip user interface (UI), or by the processor 122.

The memory controller 114 receives a self-refresh command from the MSCL 102 on line 126 subsequent to the completion of the current memory transactions, and prior to receiving the selected parameters from the register array. The MSCL 102 deasserts the self-refresh command on line 126 after the selected parameters are received by the memory controller 114 on line 122, and deasserts the hold signal to the processor on line 124. The self-refresh mode of memory operation is well understood in the art. When the memory 120 is placed into the self-refresh mode, it no longer pays attention to the control signals coming to it from the memory controller 114. In this mode, the memory 120 takes over the duties, from the memory controller 114, of refreshing all the memory locations so that no data is lost. As noted above, data can be corrupted if the capacitive charges representing stored data are permitted to drain. In one aspect subsequent to deasserting the self-refresh command, the MSCL 102 commands the memory controller 114 to perform a memory test, to verify that the off-SoC memory 120 is operational. In this scenario, the MSCL deasserts the hold signal to the processor if the memory test passes. However, if the memory test fails, the MSCL 102 resends the self-refresh command on line 126 and commands the reinstallation of the initial set of parameters in RAM 116.

In another aspect, the register array 108 has an interface on line 104a to accept a thermal trip memory speed command representing an overheating state that automatically triggers the selection of a thermal cool-down register 110p with default minimum frequency control parameters. For example, the thermal trip memory speed command may be sourced by thermal management core 130. Details of the thermal management core are provided in parent application Ser. No. 12/687,817, which is incorporated herein by reference. The thermal trip memory speed command, or an associated command, is also sent to the MSCL 102 on line 104a.

In a different aspect, the MSCL 102 accepts an auto-change memory speed command associated with a first one of a plurality of memory operating frequencies on line 104b. As shown, the auto-change memory speed command is sourced by processor 122. Alternately, the command may be sourced from the user interface. The MSCL 102 sends a first parameter select signal on line 106 in response to the command on line 104*b*. The register array 108 selects a first register (e.g., register 110*a*) in response to the first parameter select signal on line 111 and reads a first set of parameters from the first register associated with the first memory operating frequency.

Thus, the register array 108 may send a first set of parameters to the memory controller 114 to replace the initial set of parameters. The memory controller 114 operates the off-SoC memory 120 at an initial frequency associated with the initial set of parameters, and subsequent to receiving the first set of parameters, operates the off-SoC memory 120 at a first frequency associated with the first set of parameters, which is different from the initial frequency.

The registers 110 may include one or more of the following memory control parameters; column address strobe (CAS) latency (tAAmin), row address strobe (RAS) to CAS delay (tRCDmin), active to precharge delay time (tRAS min), active to active refresh delay time (tRC min), and combinations of the above-mentioned parameters. These parameters, although well understood in the art, are explained in greater detail below.

As used in this application, the terms "core" refers to an integrated circuit die of connected hardware sub-components that supply electrical signals in response to electrical signal stimuli. While these electrical signals may be indirectly affected by software operations performed external to die, there is no processor or software application internal to the die generating electrical signals. Any logic functions performed internal to the core are the result of a hardware-based state machine type logic.

Functional Description

What we are proposing is adding the memory speed feature to address power consumption and thermal control of the memory. When the thermal sensor on memory or board indicates a heat issue, we can on-the-fly change the memory speed without memory corruption. The heat issue may be due to frequent access to the memory, reduced airflow due to failing exhaust fans, or failing circuitry around the memory. By addressing these issues, we are able to keep the system up and running in a safe mode until the airflow issues can be solved. This is important for high availability systems.

In another scenario, as discussed in previous applications, when the CPU frequency and voltage are reduced (either due to power reduction or due to improperly adhered heatsinks/thermal issues), it does not make much sense to leave the memory running at full throttle since the memory would have more bandwidth than the CPU. This reduces power waste and also reduces the thermal contribution of the memory to the system.

Figure 2:
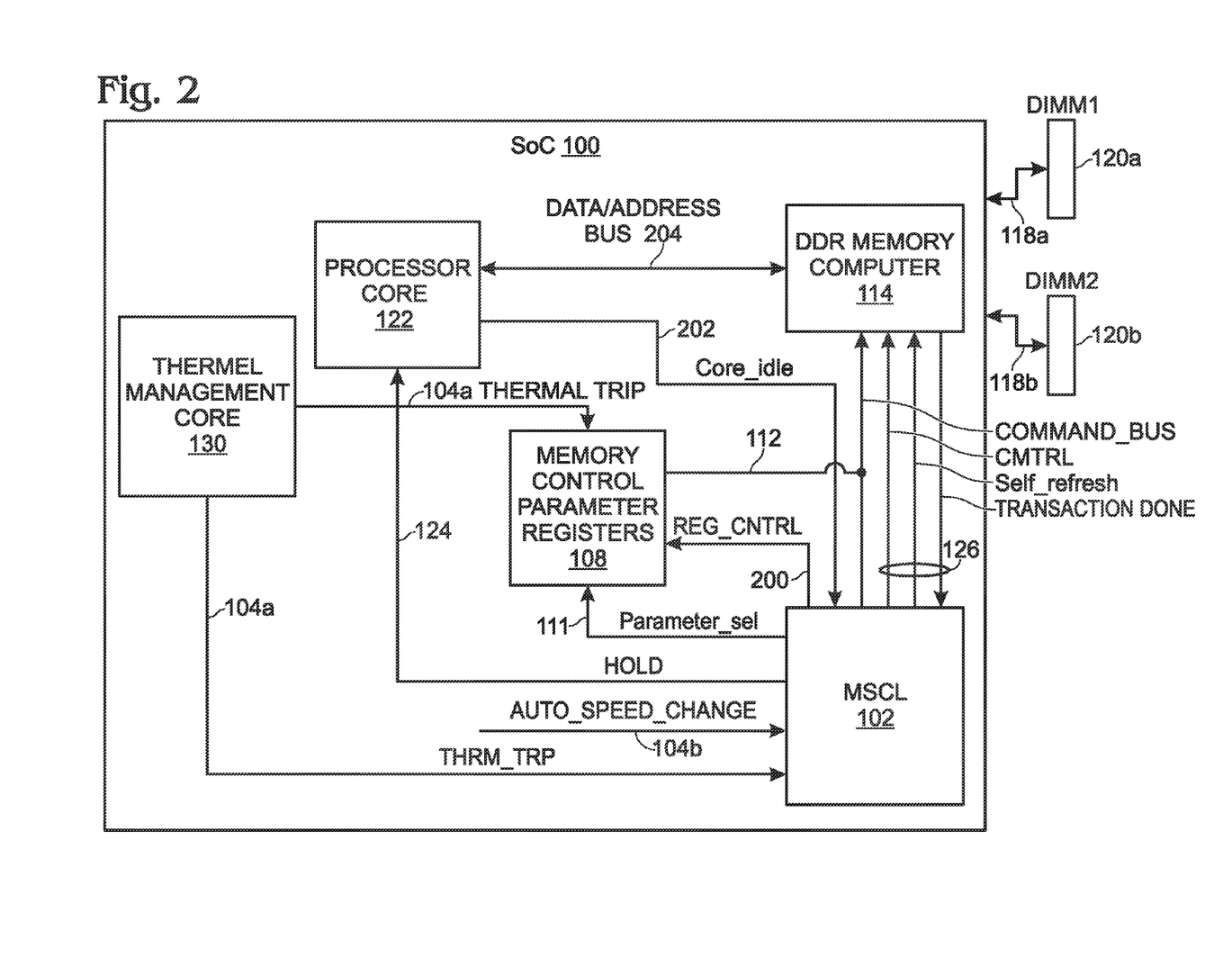
FIG. 2 is the SoC of FIG. 1, shown with additional details.

FIG. 2 is the SoC of FIG. 1, shown with additional details. The speed of a memory (e.g., DDR memory) can be changed on-the-fly. The SoC 100 has a DDR Controller 114 connected to two DIMMS—120*a* and 120*b*. The DDR Memory controller 114 is connected to the MSCL 102 via lines 112 and 126. The interface between the memory controller and MSCL consists of Command_Bus 112, and CNTRL, self-refresh, and TRANSACTION_DONE signals on line(s) 126. The MSCL 102 is connected to the memory control parameter register array 108. The interface signals are: REG_CNTRL on line 200 and Paramter_sel on line 111. The processor core 122 is connected to the MSCL 102 through the signals HOLD (line 124) and core_idle (line 202). The thermal management core 130 is connected to the MSCL 102 and memory control parameter register array 108 to supply the thermal trip memory speed command on line 104*a*.

Figure 3:
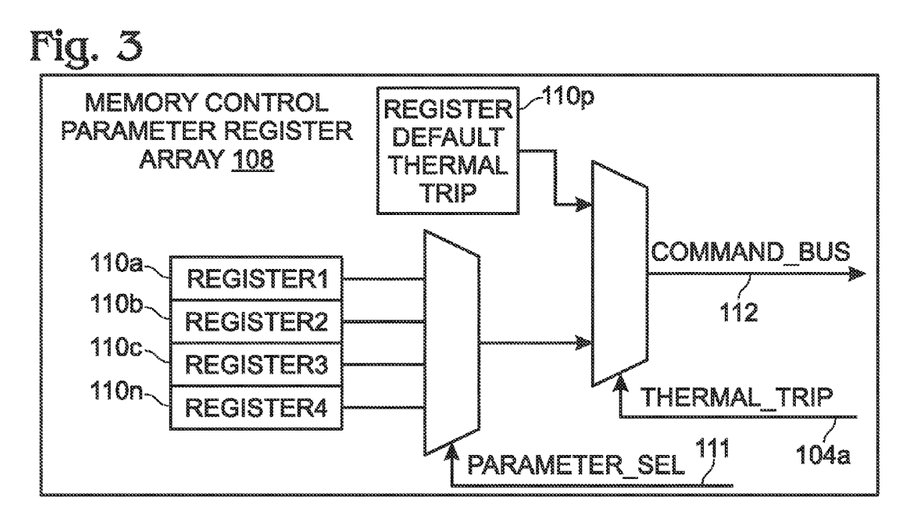
FIG. 3 is a schematic block diagram depicting a detailed example of the register array of FIGS. 1 and 2.

FIG. 3 is a schematic block diagram depicting a detailed example of the register array of FIGS. 1 and 2. The parameters associated with the auto-change memory speed commands are stored in registers 110*a* through 110*n*, and are selected as a result of the parameter select command on line 111. The parameters associated with the thermal trip memory speed command are stored in register 110*p* and given priority selection over the other registers as a result of the command on line 104*a*.

Contrasting FIGS. 2 and 3, the auto-change memory speed commands (registers 110*a*-110*n*) are useful for both power saving mode and for thermal management. There are three methods to implement a power saving mode. A graphical user interface (GUI) method permits a user to set a target DDR memory speed, via line 104*b*, based on the type of applications that are being run. A memory monitoring method uses a software application (not shown) to monitor the workload of the DDR Memory 120. Decisions regarding the DDR memory speed are entered via line 104*b*, based upon the work load. In a processor management method, the processor sends a command to the MSCL, via line 202, to enter a deep power savings mode when the processor core is idle. In this aspect, the MSCL orders the memory controller 114 to put the DDR DIMMs 120 into self-refresh mode.

Figure 4:
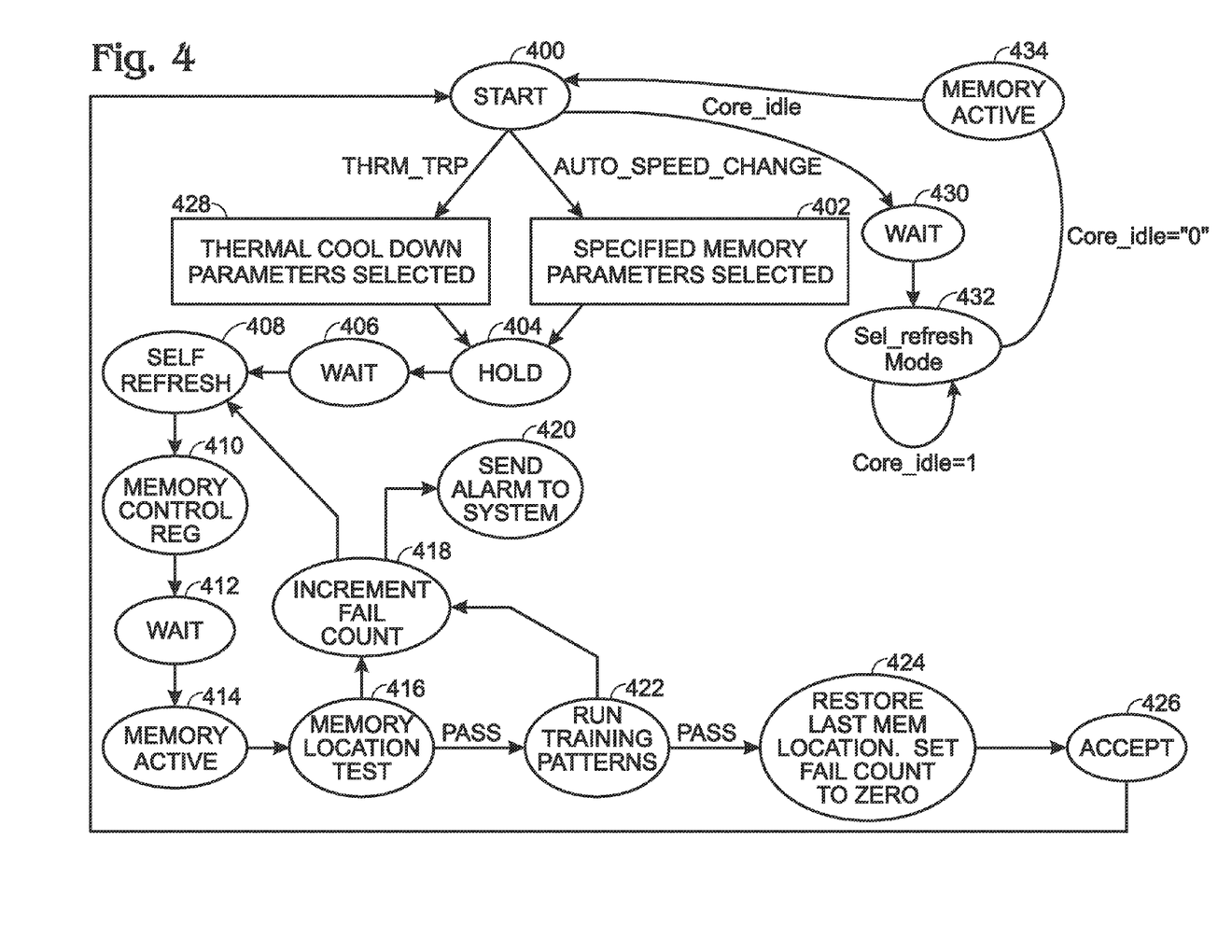
FIG. 4 is a state machine diagram depicting the operation of the SoC of FIGS. 1 and 2.

FIG. 4 is a state machine diagram depicting the operation of the SoC of FIGS. 1 and 2. In a first example, a user wants to implement a higher performance mode. It can be done either automatically (memory monitoring) or via the GUI. If the GUI-based method is used, the user sets the desired frequency in Step 402. The software writes an auto-change memory speed command to the MSCL. In Step 404 the MSCL waits for current memory transactions to complete. The current transaction's completion is indicated by the assertion of the TRANSACTION_DONE signal (see FIG. 2).

In Step 406 the MSCL asserts a hold signal to the processor, and will not accept any new memory transactions. In Step 408 a self-refresh command is sent to the memory controller, which causes the memory to be put into the self-refresh mode. In Step 410 the MSCL sends a parameter selection command to the parameter register array, causing the selection of new parameters. In Step 412 the MSCL waits for the memory clock and other controls signals to stabilize. Step 414 deasserts the self-refresh command, which the memory controller passes on to the memory. A memory location test is preformed in Step 416. A memory read operation is performed on the last addressed memory location and compared to the value that was stored by the MSCL.

If the test fails, Step 418 selects the original memory parameters and the fail count is incremented. If the fail count is below threshold, the state machine returns to Step 408 and restores the original memory parameters. If the fail count is at threshold, an alarm is sent in Step 420. If the test passes, Step 422 runs training patterns. Correct memory operation is verified by sending different data patterns to the last addressed location. If verification fails, the state machine proceeds to Step 418. If the memory operations are verified, Step 424 restores the last memory location, and resets the fail count to zero. In Step 426 the MSCL deasserts the hold signal, indicating to the processor that the memory controller and memory are ready to receive new commands, and the state machine returns to Step 400.

If during the performance of these steps, the thermal management core detects a rise in the thermal conditions of the system (the board on which the SoC is mounted, or SoC die itself), it sends a high priority signal named THERMAL_TRIP in Step 428, which overwrite the user-defined timing parameters with default timing parameters (Default thermal trip). Thus, the thermal management core has a higher precedence over deciding the DDR frequency than a high performance mode or power saving mode. Following Step 428, Steps 404 through 426 are performed as described above.

In another scenario, the processor core is idle and wants to go into a deep power saving mode. The processor asserts core_idle signal (line 202, FIG. 2), which triggers the state machine to move to the wait state of Step 430. In Step 430 the MSCL waits for the current memory transactions to complete. The completion of the current transactions is signaled by the assertion of the TRANSACTION_DONE signal. Once the current transactions are completed, the MSCL sends a self-refresh command to the memory controller, which is maintained until the core_idle signal is deasserted. The memory returns to the active state in Step 434, and the state machine returns to Step 400.

An SDRAM memory, for example, is nominally organized into a grid-like pattern of "rows" and "columns". The data stored in SDRAM comes in blocks, defined by the coordinates of row and column. The steps for the memory controller to access data in SDRAM are as follows:

1. First, the SDRAM is in an idle state.
2. The controller issues the "active" command. It activates a certain row, as indicated by the address lines in the SDRAM chip. This command typically takes a few clock cycles.
3. After the delay, the column address and either a "read" or "write" command is issued. Typically the read or write command can be repeated every clock cycle for different column addresses (or a burst mode read can be performed). The read data isn't available until a few clock cycles later, because the memory is pipelined.
4. When an access is requested to another row, the current row has to be deactivated by issuing the "precharge" command. The precharge command takes a few clock cycles before a new "active" command can be issued.

SDRAM access has four main measurements (quantified in front side bus (FSB) clock cycles) important in defining the SDRAM latency in a given computer. The 't' prefixes represent the word 'time':

tCAS—the number of clock cycles needed to access a certain column of data in SDRAM.

CAS latency, or simply CAS—is known as column address strobe latency, sometimes referred to as tCL. tRCD row address to column address delay (RAS to CAS delay) or (tRCDmin)—the number of clock cycles needed between a row address strobe (RAS) and a CAS. It is the time required between the computer defining the row and column of the given memory block and the actual read or write to that location.

tRP (row precharge time or RAS precharge)—the number of clock cycles needed to terminate access to an open row of memory, and open access to the next row.

tRAS (row active time) or tRASmin—the minimum number of clock cycles needed to access a certain row of data in RAM between the data request and the precharge command. It's known as active to precharge delay. In practice, a DDR SDRAM should be set to at least tRCD+tCAS+2 to allow enough time for data to be streamed out.

tRC (Row Cycle Time)—the row cycle time determines the minimum number of clock cycles a memory row takes to complete a full cycle, from row activation up to the precharging of the active row. Formula-wise, the row cycle time (tRC) =minimum row active time (tRAS)+row precharge time (tRP). Therefore, it is important to find out what the tRAS and tRP parameters are before setting the row cycle time. If the row cycle time is too long, it can reduce performance by unnecessarily delaying the activation of a new row after a completed cycle. Reducing the row cycle time allows a new cycle to begin earlier. However, if the row cycle time is too short, a new cycle may be initiated before the active row is sufficiently precharged. When this happens, there may be data loss or corruption. For optimal performance, the lowest value is used, according to the tRC=tRAS+tRP formula. For example, if the memory module's tRAS is 7 clock cycles and its tRP is 4 clock cycles, then the row cycle time or tRC should be 11 clock cycles.

Tables 1 through 5 below indicate a plurality of operating frequencies for a DDR memory (DDR3), which are identified as DDR3 (800, 1066, 1333, and 1666). The numbers 800, 1066, 1333, and 1666 are the memory data rates. Since the memory is clock on both edges of a clock, 800 (for example), corresponds to a 400 MHz clock being sent to the memory. Each frequency has a corresponding set of parameters. The following parameters are compared:

CAS Latency(tAAmin),
RAS to CAS Delay(tRCDmin)
Active to Precharge Delay Time (tRAS min),
Active to Active Refresh Delay Time (tRC min),

TABLE 1

| DDR3 | 400 MHz | DDR3-800 |
| DDR3 | 533 MHz | DDR3-1066 |
| DRR3 | 667 MHz | DDR3-1333 |
| DDR3 | 800 MHz | DDR-1600 |

TABLE 2

| CAS Latency(tAAmin) | | |
| --- | --- | --- |
| 12.5 ns | 400 MHz | DDR3-800 |
| 11.25 ns | 533 Mhz | DDR3-1066 |
| 10.5 ns | 667 MHz | DDR3-1333 |
| 10 ns | 800 MHz | DDR3-1600 |

TABLE 3

| RAS to CAS Delay(tRCDmin) | | |
| --- | --- | --- |
| 12.5 ns | 400 MHz | DDR3-800 |
| 11.25 ns | 533 Mhz | DDR3-1066 |
| 10.5 ns | 667 MHz | DDR3-1333 |
| 10 ns | 800 MHz | DDR3-1600 |

TABLE 4

| Active to Precharge Delay Time (tRAS min) | | |
| --- | --- | --- |
| 37.5 ns | 400 MHz | DDR3-800 |
| 37.5 ns | 533 MHz | DDR3-1066 |
| 36 ns | 667 MHz | DDR3-1333 |
| 35 ns | 800 MHz | DDR3-1600 |

TABLE 5

| Active to Active Refresh Delay Time (tRC min) | | |
| --- | --- | --- |
| 50 ns | 400 MHz | DDR3-800 |
| 48.75 ns | 533 Mhz | DDR3-1066 |
| 46.5 ns | 667 Mhz | DDR3-1333 |
| 45 ns | 800 Mhz | DDR3-1600 |

Figure 5:
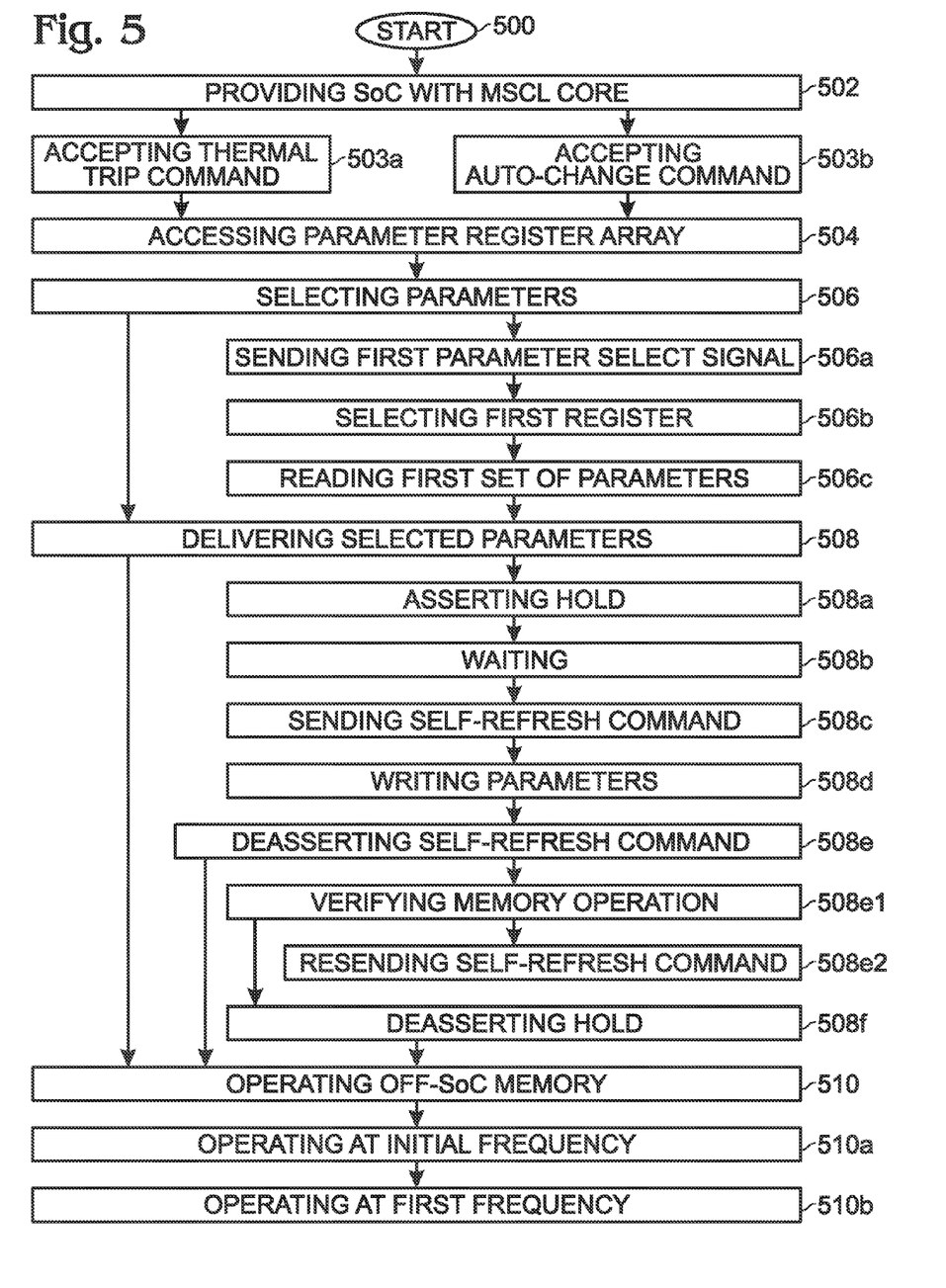
FIG. 5 is a flowchart illustrating a method for using a SoC memory speed control logic core to control memory maintenance and access parameters.

FIG. 5 is a flowchart illustrating a method for using a SoC memory speed control logic core to control memory maintenance and access parameters. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 500.

Step 502 provides a SoC with an internal hardware-enabled memory speed control logic (MSCL) core. Step 504 accesses an array of SoC memory control parameter registers. Step 506 selects a set of parameters from one of the registers. Step 508 delivers the selected set of parameters to an SoC memory controller, to replace an initial set of parameters. In Step 510 the memory controller manages an off-SoC memory using the delivered set of parameters.

In one aspect, delivering the selected set of parameters to the SoC memory controller in Step 508 includes the MSCL performing the following substeps. Step 508a asserts a hold signal, so that no new memory transactions are generated by a processor. Step 508b waits for current memory transactions to complete. Step 508c sends a self-refresh command to the memory controller. Step 508d writes the selected parameters into the memory controller from the parameter register array. Step 508e deasserts the self-refresh command, and Step 508f deasserts the hold signal.

In one aspect, subsequent to deasserting the self-refresh command, Step 508e1 commands the memory controller to perform a memory test, to verify that the off-SoC memory is operational. If the memory test passes, the hold signal is deasserted (Step 508f). If the memory test fails, Step 508e2 resends the self-refresh command and reinstalls the initial set of parameters.

In another aspect, Step 503a accepts a thermal trip memory speed command representing an overheating state. Then, selecting the set of parameters from one of the registers in Step 506 includes automatically selecting a thermal cool-down (thermal_trip) register of default minimum frequency control parameters. Alternately, the MSCL accepts an auto-change memory speed command associated with a first one of a plurality of memory operating frequencies in Step 503b. Then, selecting the set of parameters from one of the registers in Step 506 includes substeps. In Step 506a the MSCL sends a first parameter select signal to the array memory control parameter registers. Step 506b selects a first register in response to the first parameter select signal. Step 506c reads a first set of parameters from the first register associated with the first memory operating frequency.

Accessing the array of SoC memory control parameter registers in Step 504 includes accessing registers with memory control parameters such as column address strobe (CAS) latency (tAAmin), row address strobe (RAS) to CAS delay (tRCDmin), active to precharge delay time (tRAS min), active to active refresh delay time (tRC min), tCAS, tRP, and combinations of the above-mentioned parameters.

For example, if Step 508 delivers a first set of parameters to an SoC memory controller, to replace the initial set of parameters, then managing the off-SoC memory in Step 510 may include the following substeps. In Step 510a the memory controller operates the off-SoC memory at an initial frequency associated with the initial set of parameters. Subsequent to receiving the first set of parameters, in Step 510b the memory controller operates the off-SoC memory at a first frequency associated with the first set of parameters, which is different from the initial frequency.

A system and method have been provided for using a memory speed logic control core to manage a memory controller. Examples of particular message structures, processors, and hardware units have been presented to illustrate the invention. However, the invention is not limited to merely these examples. Other variations and embodiments of the invention will occur to those skilled in the art.

We claim:

1. A method for using a system-on-chip (SoC) memory speed control logic core to control memory maintenance and access parameters, the method comprising:
   providing an SoC with an internal hardware-enabled memory speed control logic (MSCL) core;
   accessing an array of SoC memory control parameter registers;
   selecting a set of parameters from one of the registers;
   delivering the selected set of parameters to an SoC memory controller, to replace an initial set of parameters;
   wherein delivering the selected set of parameters to the SoC memory controller includes the MSCL:
      asserting a hold signal, so that no new memory transactions are generated by a processor;
      waiting for current memory transactions to complete;
      sending a self-refresh command to the memory controller;
      writing the selected parameters into the memory controller;
      deasserting the self-refresh command; and,
      subsequent to deasserting the self-refresh command, commanding the memory controller to perform a memory test, to verify that the off-SoC memory is operational;
      if the memory test passes, proceeding to the deassertion of the hold signal; and,
      if the memory test fails, then resending the self-refresh command and reinstalling the initial set of parameters;
      deasserting the hold signal;
   the memory controller managing an off-SoC memory using the delivered set of parameters;
   wherein the delivered set of parameters are modified without resetting the system and without losing data in the memory.

2. The method of claim 1 further comprising: accepting a thermal trip memory speed command representing an overheating state; and, wherein selecting the set of parameters from one of the registers includes automatically selecting a thermal cool-down register of default minimum frequency control parameters.

3. The method of claim 1 further comprising: the MSCL accepting an auto-change memory speed command associated with a first one of a plurality of memory operating frequencies; and, wherein selecting the set of parameters from one of the registers includes: the MSCL sending a first parameter select signal to the array memory control parameter registers; selecting a first register in response to the first parameter select signal; and, reading a first set of parameters from the first register associated with the first memory operating frequency.

4. The method of claim 1 wherein accessing the array of SoC memory control parameter registers includes accessing registers with memory control parameters selected from a group consisting of column address strobe (CAS) latency (tAAmin), row address strobe (RAS) to CAS delay (tRCDmin), active to precharge delay time (tRAS min), active to active refresh delay time (tRC min), tCAS, tRP, and combinations of the above-mentioned parameters.

5. The method of claim 1 wherein delivering the selected set of parameters to an SoC memory controller, to replace the initial set of parameters includes delivering a first set of parameters; wherein managing the off-SoC memory using the delivered set of parameters includes: the memory controller operating the off-SoC memory at an initial frequency associated with the initial set of parameters; and, subsequent to receiving the first set of parameters, the memory controller operating the off-SoC memory at a first frequency associated with the first set of parameters, which is different from the initial frequency.

6. A system-on-chip (SoC) with memory speed control logic to control memory maintenance and access parameters, the SoC comprising:

a processor;

an internal hardware-enabled memory speed control logic (MSCL) core having an interface to accept memory speed commands and an interface to supply parameter select commands;

wherein the MSCL has an interface connected to the processor and an interface connected to the memory controller, wherein the MSCL, subsequent to receiving a memory speed change command, asserts a hold signal to the processor, so that no new memory transactions are generated by the processor, and waits for current memory transactions to complete;

an array of memory control parameter registers having an interface to supply a selected a set of parameters from one of the registers; and, a memory controller having an interface to accept the selected set of parameters from the register array, to replace an initial set of parameters, and an interface connected to an off-SoC memory, wherein the memory controller receives a self-refresh command from the MSCL, subsequent to the completion of the current memory transactions and prior to receiving the selected parameters from the register array; and, wherein the MSCL deasserts the self-refresh command after the selected parameters are received by the memory controller, and subsequent to deasserting the self-refresh command, commands the memory controller to perform a memory test, to verify that the off-SoC memory is operational, and if the memory test passes, deasserts the hold signal to the processor, but if the memory test fails, resends the self-refresh command and commands the reinstallation of the initial set of parameters;

deasserts the hold signal to the processor;

the memory controller managing the off-SoC memory using the accepted set of parameters, wherein the set of parameters are modified without resetting the system and without losing data in the memory.

7. The SoC of claim 6 wherein the register array has an interface to accept a thermal trip memory speed command representing an overheating state that automatically triggers the selection of a thermal cool-down register with default minimum frequency control parameters.

8. The SoC of claim 6 wherein the MSCL accepts an auto-change memory speed command associated with a first one of a plurality of memory operating frequencies, and sends a first parameter select signal in response; and, wherein the register array selects a first register in response to the first parameter select signal and reads a first set of parameters from the first register associated with the first memory operating frequency.

9. The SoC of claim 6 wherein register array includes registers with memory control parameters selected from a group consisting of column address strobe (CAS) latency (tAAmin), row address strobe (RAS) to CAS delay (tRCDmin), active to precharge delay time (tRAS rain), active to active refresh delay time (tRC min), tCAS, tRP, and combinations of the above-mentioned parameters.

10. The SoC of claim 6 wherein the register array sends a first set of parameters to the memory controller, replacing the initial set of parameters; and, wherein the memory controller operates the off-SoC memory at an initial frequency associated with the initial set of parameters, and subsequent to receiving the first set of parameters, operates the off-SoC memory] at a first frequency associated with the first set of parameters, which is different from the initial frequency.

* * * * *